(12) United States Patent
Oh

(10) Patent No.: US 8,837,231 B2
(45) Date of Patent: *Sep. 16, 2014

(54) INTEGRATED CIRCUIT, MEMORY SYSTEM, AND OPERATION METHOD THEREOF

(75) Inventor: Seung-Min Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 321 days.

This patent is subject to a terminal disclaimer.

(21) Appl. No.: 13/340,015

(22) Filed: Dec. 29, 2011

(65) Prior Publication Data

US 2012/0170384 A1    Jul. 5, 2012

(30) Foreign Application Priority Data

Dec. 30, 2010 (KR) .................. 10-2010-0138510

(51) Int. Cl.
*G11C 7/10* (2006.01)
*G11C 7/22* (2006.01)

(52) U.S. Cl.
CPC .............. *G11C 7/1093* (2013.01); *G11C 7/222* (2013.01); *G11C 7/1084* (2013.01)
USPC ....... 365/189.05; 365/191; 365/193; 711/167

(58) Field of Classification Search
CPC ........ G11C 7/10; G11C 7/1003; G11C 7/222; G11C 7/1093; H01L 25/00
USPC ...................... 365/189.05, 191, 193; 711/167
See application file for complete search history.

(56) References Cited

U.S. PATENT DOCUMENTS

| 7,978,547 B2* | 7/2011 | Kim .............................. 365/194 |
| 8,504,789 B2* | 8/2013 | Pyeon et al. .................. 711/167 |
| 8,611,161 B2* | 12/2013 | Oh ........................ 365/189.05 |
| 2012/0081981 A1* | 4/2012 | Oh ................................ 365/193 |

FOREIGN PATENT DOCUMENTS

| KR | 1020030070325 | 8/2003 |
| KR | 1020080051835 | 6/2008 |

OTHER PUBLICATIONS

Notice of Allowance issued by the Korean Intellectual Property Office on Jan. 25, 2013.

* cited by examiner

*Primary Examiner* — Toan Le
(74) *Attorney, Agent, or Firm* — IP & T Group LLP

(57) ABSTRACT

An integrated circuit includes an input pad configured to receive a low-speed signal and a high-speed signal, a high-speed buffer coupled to the input pad, a low-speed buffer coupled to the input pad, a strobe input unit configured to receive a strobe signal for indicating an input of the high-speed signal to the input pad, and a buffer control unit configured to control an activation of the high-speed buffer in response to the strobe signal.

16 Claims, 7 Drawing Sheets

INTEGRATED CIRCUIT, MEMORY SYSTEM, AND OPERATION METHOD THEREOF

CROSS-REFERENCE TO RELATED APPLICATIONS

The present application claims priority of Korean Patent Application No. 10-2010-0138510, filed on Dec. 30, 2010, which is incorporated herein by reference in its entirety.

BACKGROUND

1. Field

Exemplary embodiments of the present invention relate to technology for controlling a buffer configured to receive a high-speed signal and a low-speed signal through a channel.

2. Description of the Related Art

A buffer is a circuit configured to receive a signal inputted to an integrated circuit. In general, a buffer capable of receiving (recognizing) a signal inputted at high speed (i.e., a signal of high frequency) consumes a large amount of current, and a buffer which does not receive a signal inputted at high speed but is capable of receiving a signal inputted at low speed (i.e., a signal of low frequency) consumes a small amount of current.

An I/O pin of a flash memory may receive a command and an address which are low-speed signals and may receive data which are high-speed signals. When a high-speed buffer is used to receive a signal applied to the I/O pin, the logic level of the signal may be properly recognized, but a large amount of current may be consumed. Furthermore, when a low-speed buffer is used to receive a signal applied to the I/O pin, the power consumption may be reduced, but it may be difficult to recognize the logic level of the signal inputted at high speed. Therefore, technology capable of properly recognizing high-speed and low-speed data and reducing power consumption is being developed. Such a technology may be commonly applied to not only a flash memory, but also all kinds of integrated circuits receiving a high-speed signal or low-speed signal through the same pin.

FIG. 1A illustrates an inverter-type buffer which is one of low-speed buffers. FIG. 1B illustrates an amplifier-type buffer which is one of high-speed buffers.

Referring to FIG. 1A, the inverter-type buffer includes a plurality of PMOS transistors 101, 102, 104, and 105, and a plurality of NMOS transistors 103, 106, and 107.

When an off/off signal ON/OFF is at a logic low level, the PMOS transistors 101 and 104 are turned on to enable the inverter-type buffer.

In such a state that the inverter-type buffer is enabled, when an input signal IN has a logic high level, the NMOS transistor 103 and the PMOS transistor 105 are turned on, and an output signal OUT of the buffer becomes high. Furthermore, when the input signal IN has a logic low level, the PMOS transistor 102 and the NMOS transistor 106 are turned on, and the output signal OUT of the buffer becomes low. Since such an inverter-type buffer consumes current only when a signal is inputted, the inverter-type buffer consumes a small amount of current, but may not properly recognize the logic value of a signal inputted at high speed, that is, a signal having a small swing width. FIG. 1A illustrates the structure of the most basic inverter-type buffer, and the inverter-type buffer may have a variety of structures different from that of FIG. 1A.

Referring to FIG. 1B, the amplifier-type buffer has a differential amplifier structure which detects a potential difference between an input signal IN and a reference voltage VREF. Two PMOS transistors 108 and 109 form a current mirror structure such that the same current is supplied to two nodes A and B, and voltages of the two nodes A and B are differentially amplified by a potential difference between a reference voltage VREF and an input signal IN which are inputted to NMOS transistors 110 and 111, respectively. Accordingly, when the input signal IN has a higher voltage level than the reference voltage VREF, an output signal OUT has a logic high level, and when the input signal IN has a lower voltage level than the reference voltage VREF, the output signal OUT has a logic low level. An NMOS transistor 112 receiving an on/off signal ON/OFF is turned on when the on/off signal is at a logic high level. When the NMOS transistor 112 is turned on, the buffer is enabled, and when the NMOS transistor 112 is turned off, the buffer is disabled. Accordingly, the amplifier-type buffer is enabled when the on/off signal ON/OFF is at logic high level.

Such an amplifier-type buffer may accurately recognize the logic value of an input signal IN even when the input signal IN has a small swing width, that is, the input signal IN is applied at high speed. However, since current always flows in the buffer while the buffer is enabled, a large amount of current may be consumed. FIG. 1B illustrates the structure of the most basic amplifier-type buffer, and the amplifier-type buffer may have a variety of structures different from that of FIG. 1B.

SUMMARY

Exemplary embodiments of the present invention are directed to technology for reducing power consumption while accurately receiving a high-speed signal and a low-speed signal through a channel.

In accordance with an exemplary embodiment of the present invention, an integrated circuit includes an input pad configured to receive a low-speed signal and a high-speed signal, a high-speed buffer coupled to the input pad, a low-speed buffer coupled to the input pad, a strobe input unit configured to receive a strobe signal for indicating an input of the high-speed signal to the input pad, and a buffer control unit configured to control an activation of the high-speed buffer in response to the strobe signal.

The buffer control unit may enable the high-speed buffer in response to a preamble section of the strobe signal, and disable the high-speed buffer in response to a postamble section of the strobe signal. The buffer control unit may disable the low-speed buffer when the high-speed buffer is enabled, and enable the low-speed buffer when the high-speed buffer is disabled.

In accordance with another exemplary embodiment of the present invention, a memory system includes a memory including a high-speed buffer and a low-speed buffer, a memory controller, an input/output (I/O) channel configured to transfer a command, an address, and data between the memory and the memory controller, and a strobe channel configured to transfer a strobe signal between the memory and the memory controller, wherein the strobe signal indicates a transfer of the data by the I/O channel, wherein the memory is configured to selectively activate the high-speed buffer and the low-speed buffer in response to the strobe signal and receive a signal the command, the address, and the data transferred by the I/O channel.

The memory may enable the high-speed buffer during a period from a time point where a preamble of the strobe signal is detected to a time point where a postamble of the strobe signal is detected. The memory may disable the low-speed buffer during an enable period of the high-speed buffer, and enable the low-speed buffer during a disable period of the high-speed buffer.

In accordance with yet another exemplary embodiment of the present invention, an operation method of a memory system including a memory and a memory controller includes transmitting, by the memory controller a strobe signal of a first section to a strobe channel deactivating, by the memory, a low-speed buffer coupled to an I/O channel and activating a high-speed buffer coupled to the I/O channel, in response to the first section of the strobe signal, transmitting, by the memory controller, the strobe signal of a toggling section to the strobe channel and transmitting data to the I/O channel, receiving, by the memory, the data from the I/O channel using the high-speed buffer, transmitting, by the memory controller, the strobe signal of a second section to the strobe channel; and deactivating, by the memory, the high-speed buffer and activating the low-speed buffer, in response to the second section of the strobe signal.

DETAILED DESCRIPTION

Figure 1A:
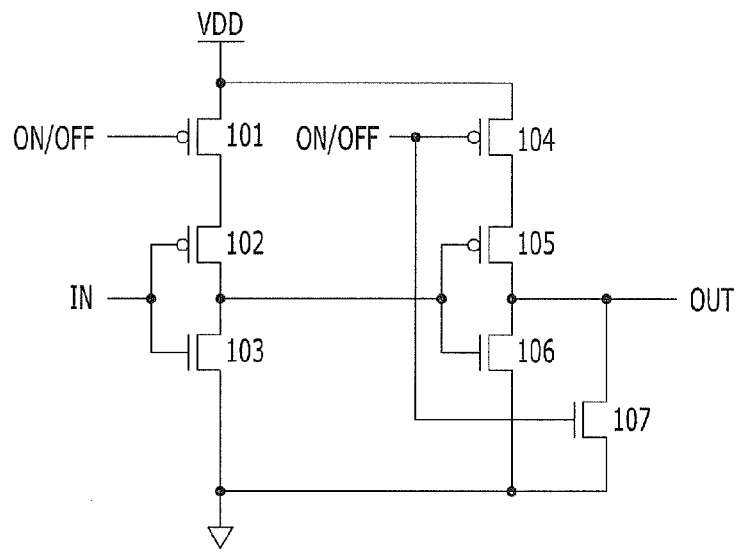
FIG. 1A illustrates an inverter-type buffer which is one of low-speed buffers.
Figure 1B:
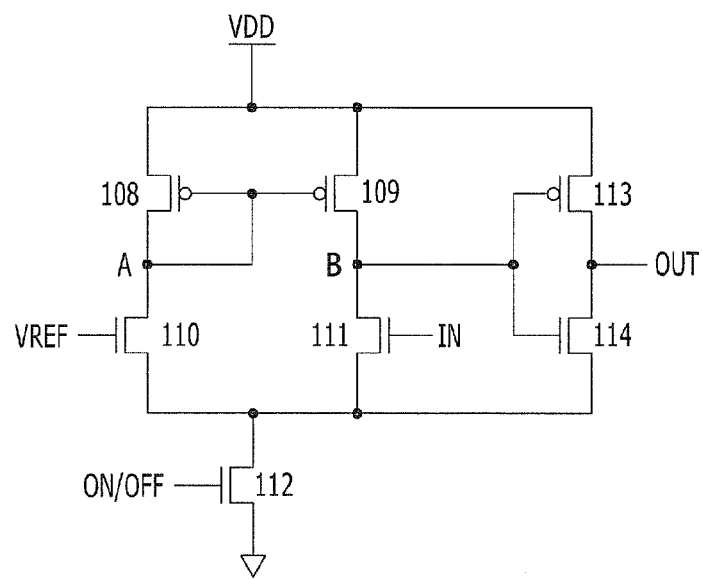
FIG. 1B illustrates an amplifier-type buffer which is one of high-speed buffers.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
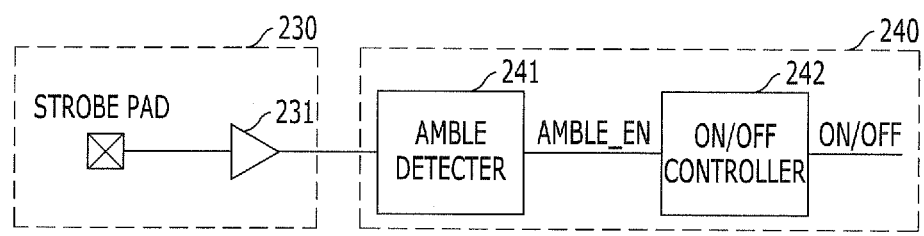
FIG. 2 is a block diagram of illustrating an integrated circuit in accordance with an exemplary embodiment of the present invention.
Figure 2:
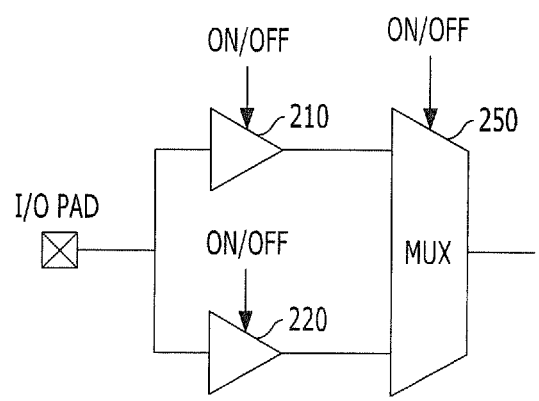

FIG. 2 is a block diagram of showing an integrated circuit in accordance with an exemplary embodiment of the present invention.

Referring to FIG. 2, the integrated circuit includes an input pad I/O PAD, a high-speed buffer 210, a low-speed buffer 220, a strobe input unit 230, a buffer control unit 240, and a selection unit 250.

The input pad I/O PAD is configured to receive a signal applied from the outside of an integrated circuit chip. The input pad I/O PAD may receive a high-speed (high-frequency) signal and a low-speed (low-frequency) signal.

The high-speed buffer 210 may recognize both of the high-speed signal and the low-speed signal which are inputted to the input pad I/O PAD by using a large amount of current. The low-speed buffer 220 consumes a small amount of current, but may recognize only a low-speed signal inputted to the input pad I/O PAD and may not recognize a high-speed signal. The high-speed buffer 210 and the low-speed buffer 220 are opposed to each other. That is, a buffer, which relatively exhibits an excellent performance, but consumes a large amount of current, compared with another buffer, may be referred as the high-speed buffer 210, and the other buffer may be referred as the low-speed buffer 220. Examples of the high-speed buffer 210 may include an amplifier-type buffer, and examples of the low-speed buffer 220 may include an inverter-type buffer.

The strobe input unit 230 is configured to receive a strobe signal STROBE applied from the outside of the integrated circuit chip. The strobe input unit 230 includes a strobe pad STROBE PAD and a buffer 231. Desirably, the buffer 231 may include a high-speed buffer. The strobe signal STROBE is a signal for indicating that a high-speed signal is applied to the input pad I/O PAD and is transferred through a similar path to that of the signal applied to the input pad I/O PAD. The strobe signal STROBE is not used when a low-speed signal is inputted to the input pad I/O PAD. Since a low-speed signal has a sufficient margin, a strobe signal may not be provided separately. That is, the strobe signal STROBE is a signal for stably latching a high-speed signal, when the high-speed signal is inputted to the input pad I/O PAD. A component for latching the signal inputted to the input pad I/O PAD is not illustrated in FIG. 2, for the purpose of description. The strobe signal STROBE toggles when a high-speed signal is inputted to the input pad I/O PAD. Furthermore, the strobe signal STROBE has a predetermined preamble section immediately before the high-speed signal is inputted to the input pad I/O PAD and has a predetermined postamble section immediately after the high-speed signal is inputted to the input pad.

The buffer control unit 240 is configured to control the activation of the high-speed buffer 210 and the low-speed buffer 220. When a low-speed signal is inputted to the input pad I/O PAD, the buffer control unit 240 enables the low-speed buffer 220, and when a high-speed signal is inputted to the input pad I/O PAD, the buffer control unit 240 enables the high-speed buffer 210. Through such an operation, the current consumption of the integrated circuit may be minimized, and the integrated circuit may stably receive data. The buffer control unit 240 controls the activation of the high-speed buffer 210 and the low-speed buffer 220 in response to the strobe signal STROBE. Specifically, the buffer control unit 240 enables the high-speed buffer 210 in response to the preamble section of the strobe signal STROBE and disables the high-speed buffer 210 in response to the postamble of the strobe signal STROBE. During a period from the preamble section of the strobe signal STROBE to the postamble section of the strobe signal STROBE, a high-speed signal is inputted to the input pad I/O PAD. The activation/deactivation of the low-speed buffer 220 is controlled in the opposite manner to that of the high-speed buffer 210. That is, when the high-speed buffer 210 is enabled, the low-speed buffer 220 is disabled, and when the high-speed buffer 210 is disabled, the low-speed buffer 220 is enabled.

The buffer control unit 240 includes an amble detector 241 and an on/off controller 242. When the strobe signal STROBE maintains a logic low level during a predetermined period or more, the amble detector 241 recognizes a preamble or postamble section of the strobe signal STROBE and activates an amble-enable signal AMBLE_EN. The on/off controller 242 changes the logic level of the on/off signal ON/OFF whenever the amble-enable signal AMBLE_EN is activated. The on/off controller 242 may be implemented with a simple T flip-flop circuit. The on/off signal ON/OFF controls the activation/deactivation of the high-speed buffer 210 and the low-speed buffer 220. The high-speed buffer 210 is enabled when the on/off signal ON/OFF is at a logic high level, and the low-speed buffer 220 is enabled when the on/off signal ON/OFF is at a logic low level.

As described above, when the strobe signal STROBE maintains a logic low level during a predetermined period or more, the detector 241 activates the amble-enable signal AMBLE_EN. This is because the preamble section and the postamble section are defined as a section in which the strobe signal STROBE maintains a logic low level during a predetermined period. The preamble section and the postamble section may be defined as a section in which the strobe signal STROBE maintains a logic high level during a predetermined period or more. In this case, the detector 241 activates the amble-enable signal AMBLE_EN when the strobe signal STROBE maintains a logic high level during a predetermined period or more.

The selector 250 selects and outputs an output of the low-speed buffer 220, while the low-speed buffer 220 is enabled, and selects and outputs an output of the high-speed buffer 210, while the high-speed buffer 210 is enabled. That is, the selector 250 selects the output of the low-speed buffer 220, when the on/off signal ON/OFF is a logic low level, and selects the output of the high-speed buffer 210, when the on/off signal ON/OFF is at a logic high level. The output of the selector 250 is transferred to a circuit (not illustrated) inside the integrated circuit using a signal inputted to the input pad I/O PAD.

FIG. 2 illustrates that the integrated circuit includes one input pad I/O PAD. However, a plurality of input pads I/O PAD and a plurality of high-speed buffers 210 and low-speed buffers 220 coupled to the input pads I/O PAD may be provided.

FIG. 2 illustrates that at least one of the high-speed buffer 210 and the low-speed buffer 220 is enabled. However, the integrated circuit may be designed in such a manner that both of the high-speed buffer 210 and the low-speed buffer 220 are disabled during a period where the integrated circuit does not operate. In this case, when an activation signal (not illustrated) of the integrated circuit is deactivated, the on/off signal ON/OFF inputted to the high-speed buffer 210 may be controlled to maintain a logic low level, and the on/off signal ON/OFF inputted to the low-speed buffer 220 may be controlled to maintain a logic high level, regardless of the logic level of the on/off signal ON/OFF outputted from the on/off control unit 242.

Figure 3:
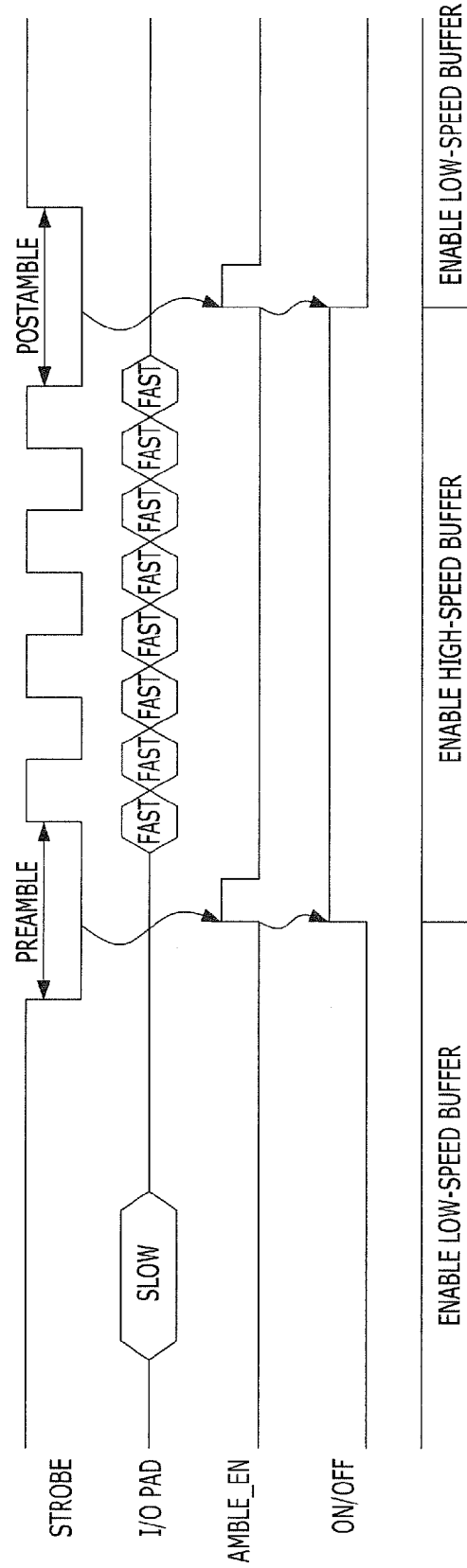
FIG. 3 is a timing diagram showing the operation of the integrated circuit shown in FIG. 2.

FIG. 3 is a timing diagram showing the operation of the integrated circuit of FIG. 2.

Referring to FIG. 3, the on/off signal maintains a logic low level as a default value, and thus the low-speed buffer 220 is enabled. Furthermore, while the low-speed buffer is enabled, a low-speed signal SLOW is inputted through the input pad and recognized by the low-speed buffer. During a period where the low-speed signal SLOW is inputted, the strobe signal STROBE is not used. That is, the strobe signal STROBE maintains a logic high level and does not toggle.

Right before high-speed signals FAST are inputted to the input pad I/O PAD, the strobe signal STROBE maintains a logic low level during a predetermined period. The predetermined period indicates a preamble section notifying that the high-speed signals FAST will be inputted. The detector 241 detects the preamble section to activate the amble-enable signal AMBLE_EN to a logic high level. Then, the on/off controller 242 changes the level of the on/off signal ON/OFF to a logic high level. Furthermore, the high-speed buffer 210 is enabled and the low-speed buffer 220 is disabled, in response to the on/off signal ON/OFF. After the high-speed signals FAST are completely inputted, the strobe signal STROBE maintains a logic low level during a predetermined period again. The predetermined period indicates a postamble section notifying that the high-speed signals FAST were completely inputted. The amble detector 241 detects the postamble section to activate the amble-enable signal AMBLE_EN to a logic high level. Then, the on/off control unit 242 changes the level of the on/off signal ON/OFF to a logic low level. Furthermore, the high-speed buffer 210 is disabled and the low-speed buffer 220 is enabled, in response to the on/off signal ON/OFF.

In other words, in the integrated circuit, the low-speed buffer 220 is basically enabled, and the high-speed buffer 210 is enabled only during the period where the high-speed signals FAST are inputted. Accordingly, the integrated circuit activates the high-speed buffer 210 only during a period, where the high-speed buffer 210 is used, and uses the low-speed buffer 220 during the other period, thereby reducing the current consumption.

Figure 4:
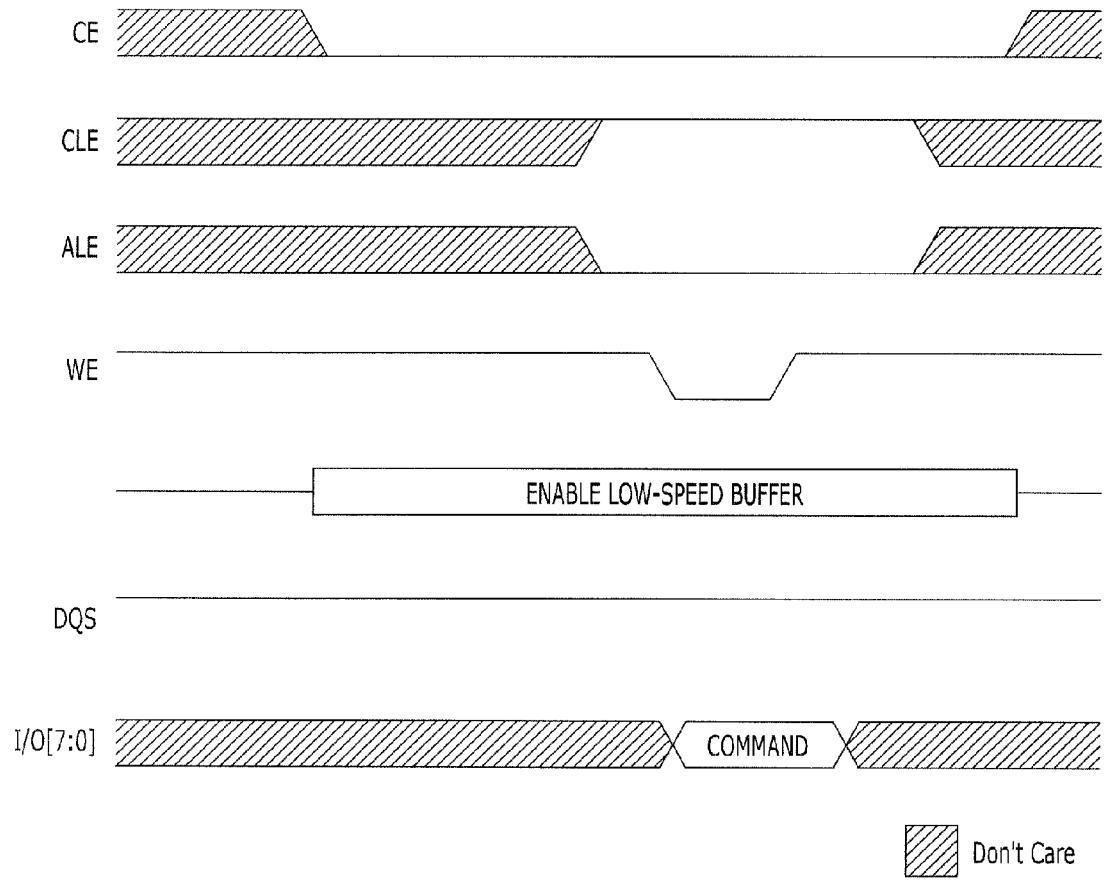
FIG. 4 is a timing diagram showing that a command is inputted in a flash memory.
Figure 5:
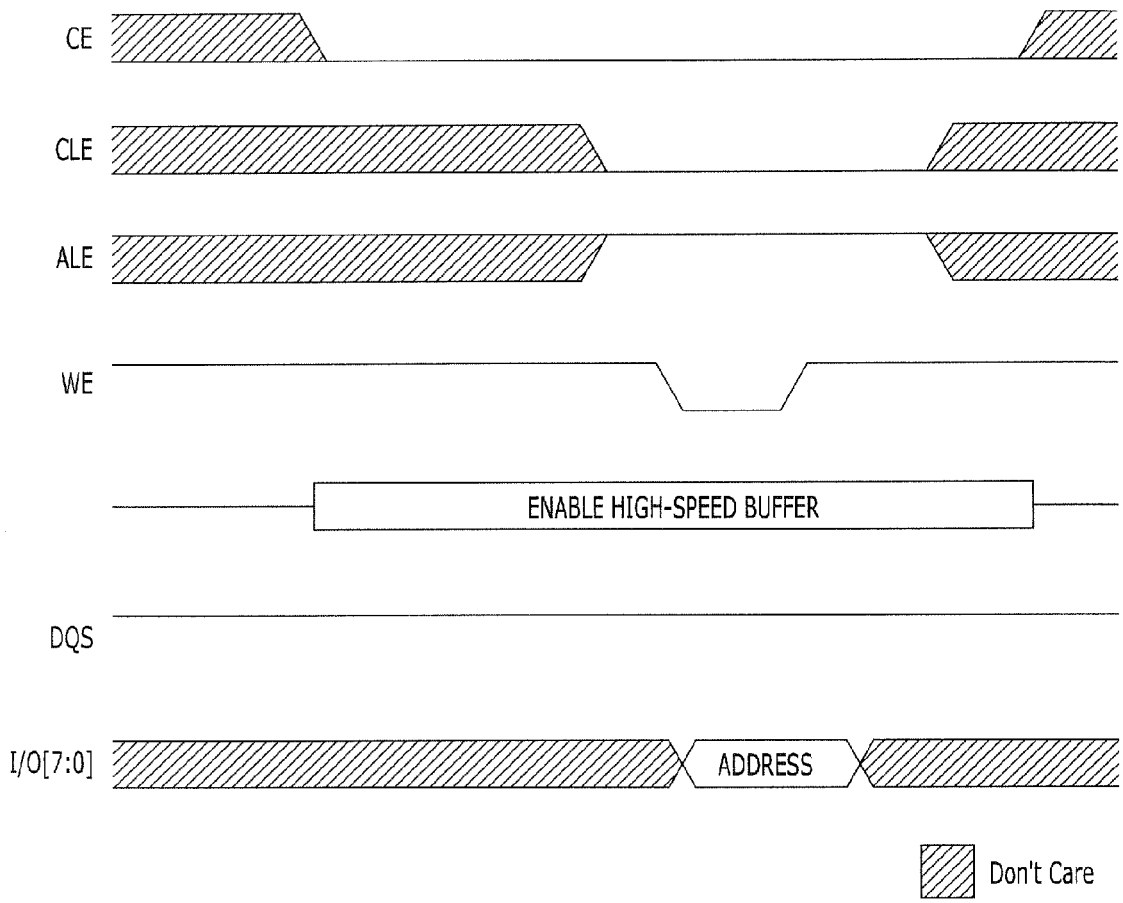
FIG. 5 is a timing diagram showing that an address is inputted in the flash memory.
Figure 6:
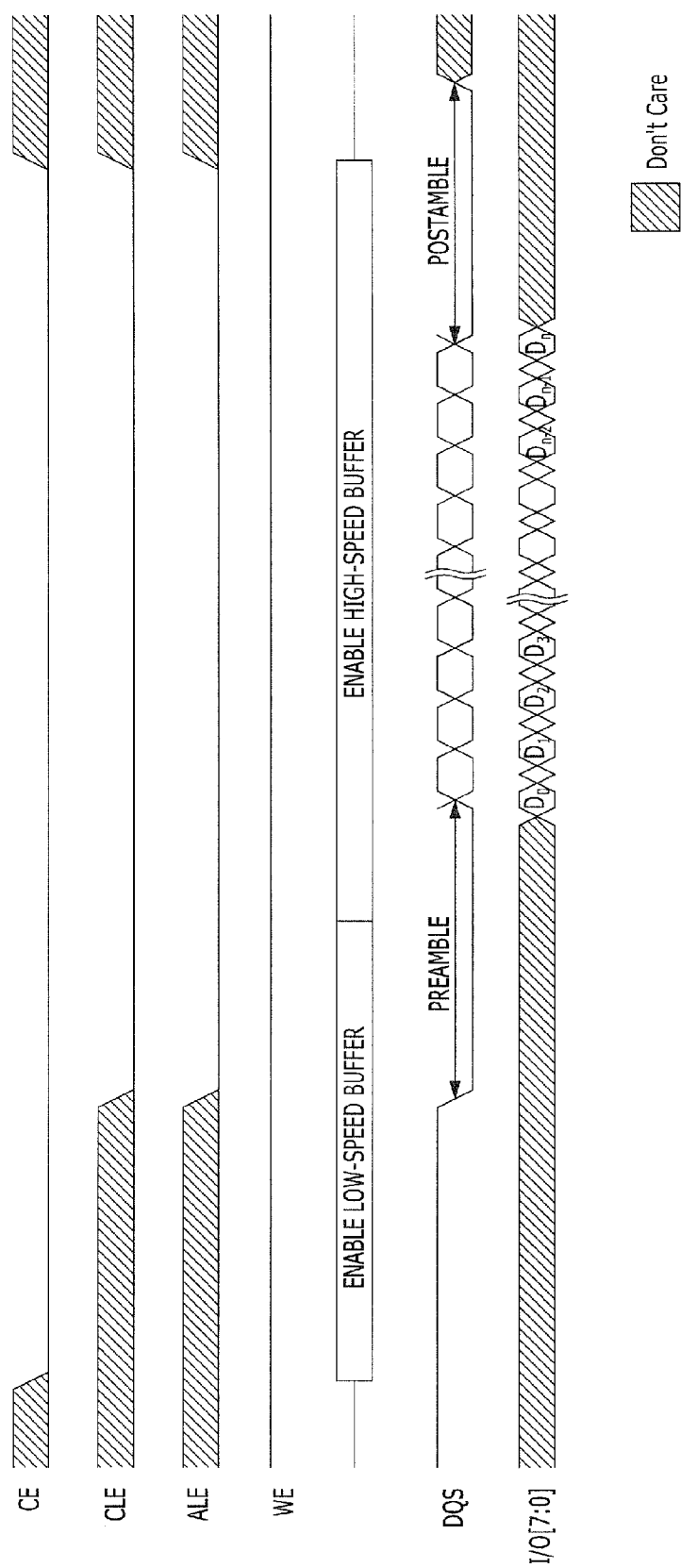
FIG. 6 is a timing diagram showing that data are inputted in the flash memory.

FIGS. 4 to 6 shows the operation of the integrated circuit in accordance with the exemplary embodiment of the present invention, when the integrated circuit operates as a flash memory.

First, signals shown in FIGS. 4 to 6 will be described.

CE represents a chip enable signal. When the chip enable signal CE is high, it indicates that the flash memory was unselected so as not to operate, and when the chip enable signal CE is low, it indicates that the flash memory was selected so as to operate.

CLE represents a command latch enable signal. The command latch enable signal CLE is activated to a logic high level, when a command is inputted to eight I/O pads I/O[0:7], and informs the flash memory that the signal inputted to the I/O pads I/O[0:7] is a command. In the flash memory, since the command is inputted to the I/O pads I/O[0:7] at low speed, the command corresponds to a low-speed signal inputted to the input pad I/O PAD of FIG. 2.

ALE represents an address latch enable signal. The address latch enable signal ALE is activated to a logic high level, when an address is inputted to eight I/O pads I/O[0:7], and informs the flash memory that the signal inputted to the I/O pads I/O[0:7] is an address. In the flash memory, since the address is inputted to the I/O pads I/O[0:7] at low speed, the address corresponds to a low-speed signal inputted to the input pad I/O PAD of FIG. 2.

WE represents a write enable signal. The write enable signal WE is activated whenever a command or address as a low-speed signal is inputted to the eight I/O pads I/O[0:7].

DQS represents a data strobe signal. The data strobe signal DQS toggles during a period where data are inputted to the I/O pads I/O[0:7]. The data strobe signal DQS has a preamble section, immediately before the data are inputted, and has a postamble section after the data are inputted. In the flash memory, since the data are inputted to the I/O pads I/O[0:7] at high speed, the data correspond to a high-speed signal inputted to the I/O pad of FIG. 2. Furthermore, since the data strobe signal DQS is a signal synchronized with a high-speed signal, the data strobe signal DQS corresponds to the strobe signal STROBE of FIG. 2.

FIG. 4 is a timing diagram showing that a command is inputted in the flash memory. Referring to FIG. 4, a command is applied through the eight I/O pads I/O[0:7] during a period where the chip enable signal CE is activated to a logic low level and the command latch enable signal CLE is activated to a logic high level. At a time point when the command is applied, the write enable signal WE is activated to a logic low level. Since the data strobe signal maintains a logic high level during the period where the command is applied, only the low-speed buffer coupled to the eight I/O pads I/O[0:7] is enabled during this period.

For reference, since no signal is inputted through the I/O pads I/O[0:7] during a period where the chip enable signal CE is deactivated, both of the high-speed buffer and the low-speed buffer which are coupled to the eight I/O pads I/O[0:7], respectively, may be disabled during this period. Even during the period where the chip enable signal CE is deactivated, one of the high-speed buffer and the low-speed buffer may be enabled.

FIG. 5 is a timing diagram showing that an address is inputted in the flash memory. Referring to FIG. 5, an address is applied through the eight I/O pads I/O[0:7] during a period where the chip enable signal CE is activated to a logic low level and the address latch enable signal ALE is activated to a logic high level. At a time point when the address is applied, the write enable signal WE is activated to a logic low level. During the period where the address is inputted, the data strobe signal maintains a logic high level. Therefore, only the low-speed buffer coupled to the eight I/O pads I/O[0:7] is enabled during this period.

FIG. 6 is a timing diagram showing that data are inputted in the flash memory. Referring to FIG. 6, data $D_0$ to $D_N$ are inputted through the eight I/O pads I/O[0:7] after the preamble section where the data strobe signal DQS maintains a logic low level, in a state that the chip enable signal CE is activated to a logic low level. During the period where the data $D_0$ to $D_N$ are inputted, the data strobe signal DQS toggles. After the data $D_0$ to $D_N$ are completely inputted, a postamble section occurs, where the data strobe signal DQS maintains a logic low level for a predetermined time. Referring to FIG. 6, the low-speed buffer is enabled after the chip enable signal CE is activated, and the high-speed buffer is again disabled after the preamble section. After the postamble section, the low-speed buffer may be enabled. However, since the chip enable signal CE is deactivated after the postamble section, FIG. 6 illustrates that no buffer is enabled.

Figure 7:
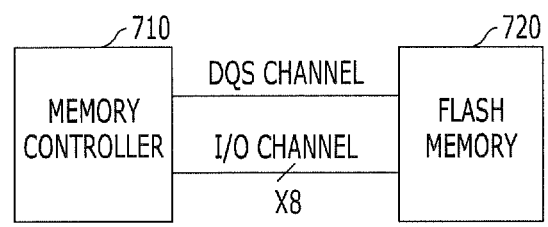
FIG. 7 is a block diagram illustrating a memory system in accordance with another exemplary embodiment of the present invention.

FIG. 7 is a diagram illustrating a memory system in accordance with another embodiment of the present invention.

Referring to FIG. 7, the memory system includes a memory controller 710, a flash memory 720, an I/O channel I/O CHANNEL, and a strobe channel DQS CHANNEL. The memory system may include channels through which signals ALE, CLE, WE, and CE are transferred between the memory controller 710 and the flash memory 720. However, the channels are not illustrated in FIG. 7, for the description purpose.

The internal configuration of the flash memory 720 may be set in the same manner as illustrated in FIG. 2. Since the I/O channel I/O CHANNEL includes eight lines, the flash memory 720 may include eight I/O pads and eight high-speed buffers 210 and eight low-speed buffers 220, which are coupled to the I/O pads, respectively.

The flash memory 720 basically enables only the low-speed buffers and receives signals of the I/O channel I/O CHANNEL which are transferred from the memory controller 710. However, during a period from the preamble section to the postamble section of a data strobe signal DQS transferred through the strobe channel DQS CHANNEL, the flash memory 720 enables the high-speed buffers and receives signals of the I/O channel I/O CHANNEL. That is, the flash memory 720 receives a command and address which are transferred as low-speed signals through the I/O channel I/O CHANNEL from the memory controller 710, using the low-speed buffers, and receives data which are transferred as high-speed signals through the I/O channel I/O CHANNEL from the memory controller 710, using the high-speed buffers.

FIG. 7 illustrates that the memory system includes the flash memory 720. However, the present invention may be applied to all kinds of memories receiving low-speed signals (for example, command and address) and high-speed signals (for example, data) through the same channel.

In accordance with the embodiment of the present invention, the high-speed buffer is enabled in response to the preamble section of the strobe signal synchronized with a high-speed signal and deactivated in response to the postamble section of the strobe signal. Furthermore, while the high-speed buffer is disabled, the low-speed buffer is enabled. Therefore, both of high-speed and low-speed signals may be stably received while a small amount of current is consumed.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
   an input pad configured to receive a low-speed signal and a high-speed signal;
   a high-speed buffer coupled to the input pad;
   a low-speed buffer coupled to the input pad;
   a strobe input unit configured to receive a strobe signal for indicating an input of the high-speed signal to the input pad; and
   a buffer control unit configured to control an activation of the high-speed buffer in response to the strobe signal.

2. The integrated circuit of claim 1, wherein the buffer control unit is configured to activate the high-speed buffer in response to a first section of the strobe signal and deactivate the high-speed buffer in response to a second section of the strobe signal,
   wherein a logic level of the strobe signal is maintained for the first section prior to the input of the high-speed signal and maintained for the second section after the input of the high-speed signal.

3. The integrated circuit of claim 2, wherein the buffer control unit is configured to deactivate the low-speed buffer, when the high-speed buffer is activated, and activate the low-speed buffer when the high-speed buffer is deactivated.

4. The integrated circuit of claim 2, wherein the buffer control unit comprises:
   a detector configured to detect the first section and the second section of the strobe signal; and
   an on/off controller configured to activate an on/off signal when the detector detects the first section, and deactivate the on/off signal when the detector detects the second section.

5. The integrated circuit of claim 4, wherein the high-speed buffer is activated during the activation period of the on/off signal, and the low-speed buffer is activated during the deactivation period of the on/off signal.

6. The integrated circuit of claim 1, wherein the integrated circuit comprises a memory,
   the low-speed signal comprises a command and an address inputted to the memory, and
   the high-speed signal comprises data inputted to the memory.

7. The integrated circuit of claim 1, wherein the high-speed buffer comprises an amplifier-type buffer, and
   the low-speed buffer comprises an inverter-type buffer.

8. The integrated circuit of claim 2, wherein the first section includes a preamble section of the strobe signal and the second section includes a postamble section of the strobe signal.

9. A memory system comprising:
- a memory comprising a high-speed buffer and a low-speed buffer;
- a memory controller;
- an input/output (I/O) channel configured to transfer a command, an address, and data between the memory and the memory controller; and
- a strobe channel configured to transfer a strobe signal between the memory and the memory controller,
- wherein the strobe signal indicates a transfer of the data by the I/O channel,
- wherein the memory is configured to selectively activate the high-speed buffer and the low-speed buffer in response to the strobe signal and receive the command, the address, and the data transferred by the I/O channel.

10. The memory system of claim 9, wherein the memory is configured to activate the high-speed buffer during a period from a time point when a first section of the strobe signal is detected to a time point when a second section of the strobe signal is detected,
- wherein a logic level of the strobe signal is maintained for the first section prior to the transfer of the data and maintained for the second section after the transfer of the data.

11. The memory system of claim 10, wherein the memory is configured to deactivate the low-speed buffer during an activation period of the high-speed buffer and activate the low-speed buffer during a deactivation period of the high-speed buffer.

12. The memory system of claim 11, wherein a chip enable signal is transferred to the memory from the memory controller, and the memory is configured to deactivate both of the high-speed buffer and the low-speed buffer, during a deactivation period of the chip enable signal.

13. The memory system of claim 10, wherein the first section includes a preamble section of the strobe signal and the second section includes a postamble section of the strobe signal.

14. An operation method of a memory system including a memory and a memory controller, comprising:
- transmitting, by the memory controller, a strobe signal of a first section to a strobe channel;
- deactivating, by the memory, a low-speed buffer coupled to an input/output (I/O) channel and activating a high-speed buffer coupled to the I/O channel, in response to the first section of the strobe signal;
- transmitting, by the memory controller, the strobe signal of a toggling section to the strobe channel and transmitting data to the I/O channel;
- receiving, by the memory, the data from the I/O channel using the high-speed buffer;
- transmitting, by the memory controller, the strobe signal of a second section to the strobe channel; and
- deactivating, by the memory, the high-speed buffer and activating the low-speed buffer, in response to the second section of the strobe signal.

15. The operation method of claim 14, wherein the high-speed buffer comprises an amplifier-type buffer, and
the low-speed buffer comprises an inverter-type buffer.

16. The operation method of claim 14, wherein the first section includes a preamble section of the strobe signal and the second section includes a postamble section of the strobe signal.

* * * * *